United States Patent [19]

Shigeta et al.

[11] Patent Number: 5,279,701

[45] Date of Patent: Jan. 18, 1994

[54] METHOD FOR THE GROWTH OF SILICON CARBIDE SINGLE CRYSTALS

[75] Inventors: Mitsuhiro Shigeta, Kyoto; Akira Suzuki, Nara; Katsuki Furukawa, Sakai; Yoshihisa Fujii, Nara, all of Japan

[73] Assignee: Sharp Kabushiki Kaisha, Osaka, Japan

[21] Appl. No.: 933,964

[22] Filed: Aug. 24, 1992

Related U.S. Application Data

[63] Continuation of Ser. No. 568,500, Aug. 15, 1990, abandoned, which is a continuation-in-part of Ser. No. 350,666, May 11, 1989, abandoned.

[30] Foreign Application Priority Data

May 11, 1988 [JP] Japan ................ 63-115080
Dec. 29, 1988 [JP] Japan ................ 63-334130
Dec. 29, 1988 [JP] Japan ................ 63-334134

[51] Int. Cl.⁵ .................. C30B 23/02; C30B 25/02
[52] U.S. Cl. .......................... 156/612; 156/610; 156/DIG. 64; 148/DIG. 148; 437/93
[58] Field of Search ............ 156/610, 611, 612, 613, 156/614, DIG. 64; 148/DIG. 648; 437/93

[56] References Cited

U.S. PATENT DOCUMENTS

| | | | |
|---|---|---|---|
| T951,008 | 10/1976 | Regh | 437/93 |
| 3,698,944 | 10/1972 | Dyer | 437/93 |
| 3,821,783 | 6/1974 | Sugita et al. | 437/93 |
| 3,920,492 | 11/1975 | Sugita et al. | 437/93 |
| 4,050,964 | 9/1977 | Rode | 437/93 |
| 4,623,425 | 11/1986 | Suzuki et al. | 156/613 |
| 4,865,659 | 9/1989 | Shigeta et al. | 148/DIG. 148 |
| 4,912,064 | 5/1990 | Kong et al. | 148/DIG. 148 |
| 5,011,549 | 4/1991 | Kong et al. | 148/DIG. 148 |

OTHER PUBLICATIONS

Kong et al The effect of off Axis Si (100) Substrates on the defect Structure and The Electrical Properties of βSiC Thin Films, J. Mater. Res. 3(3) May/Jun. 1988 pp. 521-531.

Nishino et al., Applied Physics Letters (Mar. 1, 1983) 42(5):460-462.

Shigeta et al., Applied Physics Letters (Oct. 9, 1989) 55:(15):1522-1524.

Fitzgerald et al., Applied Physics Letters (May 2, 1988) 55(18):1496-1498.

Primary Examiner—Gary P. Straub
Attorney, Agent, or Firm—Morrison & Foerster

[57] ABSTRACT

A method for the growth of silicon carbide single crystals is disclosed which includes the step of growing silicon carbide single crystals on a silicon single-crystal substrate. The silicon single-crystal substrate has growth areas with a crystal orientation inclined by an angle $\theta$ from the [100] direction toward at least one of the [011] and [0$\bar{1}$1] directions and with a lateral dimension d taken along the direction of such inclination toward the [011] or [0$\bar{1}$1] direction. The angle $\theta$ is set to be in the range of zero to $\tan^{-1}(\sqrt{2}/8)$ degrees (with the proviso that the angle $\theta$ is not equal to $\tan^{-1}(\sqrt{2}/2)$ degrees). The lateral dimension d is set to be in the range of 0.1 to 100 μm. In this method, the silicon carbide single crystals are grown to a thickness t approximately equal to or greater than $(\sqrt{2}+\tan\theta)d/|1-\sqrt{2}\tan\theta|$, so that these silicon carbide single crystals are substantially free of defects such as stacking faults.

8 Claims, 3 Drawing Sheets

METHOD FOR THE GROWTH OF SILICON CARBIDE SINGLE CRYSTALS

This application is a continuation of application Ser. No. 568,500, filed Aug. 15, 1990 now abandoned, which was a continuation in part of application Ser. No. 07/350,666 filed Aug. 11, 1989 now abandoned.

BACKGROUND OF THE INVENTION

1. Field of the invention:

This invention relates to a method for the growth of silicon carbide single crystals substantially free of defects such as stacking faults on a silicon single-crystal substrate.

2. Description of the prior art:

Silicon carbide (SiC) is a semiconductor material with a wide energy gap of 2.2 to 3.3 electron-volts (eV) as compared with conventional semiconductor materials such as silicon (Si) and gallium arsenide (GaAs), which have come into extensive use. Silicon carbide is thermally, chemically and mechanically quite stable, and also has a great resistance to radiation damage. The saturation drift velocity of electrons in silicon carbide is greater than that in silicon and other semiconductor materials. Moreover, silicon carbide has the advantage of having satisfactory stability in either case of p-type or n-type, which is rare for wide-gap semiconductors. In particular, this advantage makes it useful as a semiconductor material for optoelectronic devices utilizing visible light of short wavelengths. The use of semiconductor devices using conventional semiconductor materials such as silicon is difficult under severe conditions of high temperature, high output drive, high frequency operation, and radiation exposure. Therefore, semiconductor devices using silicon carbide are expected to have wide applications for devices which can be used under such conditions.

Despite these many advantages and capabilities, silicon carbide has not yet been placed in actual use, because the technique for growing silicon carbide single crystals with high reproducibility, which is required for the commercial production of high-quality silicon carbide wafers having a large surface area, has yet to be developed.

Conventional processes for preparing single-crystal substrates of silicon carbide on a laboratory scale include the so-called sublimation method (i.e., the Lely method) wherein silicon carbide powder is sublimed in a graphite crucible at 2,200° C. to 2,600° C. and recrystallized to obtain a silicon carbide single crystal, and the so-called epitaxial growth method wherein the silicon carbide single crystal obtained by the sublimation method is used as a substrate and silicon carbide single-crystal layers are then grown on the substrate by chemical vapor deposition (CVD) or liquid phase epitaxy (LPE), resulting in silicon carbide single crystals, the size of which is sufficient to produce semiconductor devices therefrom. Although a large number of crystals can be obtained by either the sublimation method or the epitaxial growth method, it is difficult to prepare large single crystals of silicon carbide and to control with high accuracy, the size and shape of silicon carbide single crystals. Moreover, it is also difficult to control the polytype and impurity concentration of these single crystals.

In recent years, the inventors have developed a process for growing large-sized high-quality single crystals of β-silicon carbide on a silicon single-crystal substrate by the chemical vapor deposition (CVD) technique and filed a Japanese Patent Application No. 58-76842 (76842/1983) which corresponds to U.S. Pat. No. 4,623,425. This process (referred to as a successive two step CVD technique) includes growing a silicon carbide thin film on a silicon substrate by the CVD technique at a low temperature and then growing a silicon carbide single-crystal film on this thin film by the CVD technique at a higher temperature. Results for the application of this process have also been reported in the Journal of Crystal Growth, 70, 1984.

Also, another process for growing large-sized single crystals of β-silicon carbide by the carbonization CVD technique is disclosed in Applied Physics Letters, 42(5), Mar. 1, 1983. This process includes heating the surface of a silicon single-crystal substrate in an atmosphere containing hydrocarbon gases to form a silicon carbide thin film thereon by carbonization and then growing a silicon carbide single-crystal layer on this thin film by the CVD technique.

Moreover, the inventors have devised a process for growing single crystals of α-silicon carbide and filed a Japanese Patent Application No. 58-246512 (246512/1983) which corresponds to U.S. patent application Ser. No. 683,651.

At the present time, these techniques make it possible to produce large-size high-quality single crystals or α- and β-silicon carbide, while controlling the characteristics of crystals, such as polytype, impurity concentration, size and shape. These techniques are referred to as hetero-epitaxial growth methods in association with the growth of single-crystal layers on a single-crystal substrate which is made of a different material from that of the single-crystal layers.

In general, however, when such a hetero-epitaxial growth method is employed to form an epitaxially grown layer on a single-crystal substrate, the epitaxially grown layer has a tendency to contain crystal defects, inter alia, stacking faults, because there is a difference in lattice constant, coefficient of thermal expansion, and chemical bonding between the epitaxially grown layer and the single-crystal substrate.

The lattice constant of silicon single crystals is different from that of silicon carbide single crystals by as much as 20%, and hence, there may be many stacking faults generated on the {111} planes within the silicon carbide single crystals grown on the silicon single-crystal substrate. These stacking faults exert an adverse effect on the electronic properties of the silicon carbide single crystals obtained, thereby making it difficult to obtain silicon carbide semiconductor devices with excellent characteristics. Moreover, silicon carbide single crystals have a tendency to contain crystal defects referred to as antiphase boundaries, thereby making it difficult to produce silicon carbide semiconductor devices at desired positions on a silicon substrate.

Thus, none of the growth methods set forth above can provide silicon carbide single crystals substantially free of crystal defects such as stacking faults with high reproducibility. Therefore, a continuing need exists to establish a method for the production of silicon carbide single crystals with excellent crystallinity on an industrial scale.

SUMMARY OF THE INVENTION

The method for the growth of silicon carbide single crystals of this invention, which overcomes the abovediscussed and numerous other disadvantages and deficiencies of the prior art, comprises the step of growing silicon carbide single crystals on a silicon single-crystal substrate having growth areas with a crystal orientation inclined by an angle $\theta$ from the [100] direction toward at least one of the [011] and [0$\bar{1}$1] directions and with a lateral dimension d taken along the direction of such inclination toward the [011] or [0$\bar{1}$1] direction, the angle $\theta$ being in the range of zero to $\tan^{-1}(\sqrt{2}/8)$ degrees (with the proviso that the angle $\theta$ is not equal to $\tan^{-1}(\sqrt{2}/2)$ degrees), and the lateral dimension d being in the range of 0.1 to 100 $\mu$m, wherein the silicon carbide single crystals are grown to a thickness t approximately equal to or greater than $|\sqrt{2}+\tan\theta|d/(1-\sqrt{2}\tan\theta)$.

In a preferred embodiment, the aforementioned growth areas have a crystal orientation of [100] and the silicon carbide single crystals are grown to a thickness t approximately equal to or greater than $\sqrt{2}d$.

In a preferred embodiment, the aforementioned growth areas have a crystal orientation of [n11] (where n is an integer equal to $\sqrt{2}/\tan\theta$) and the silicon carbide single crystals are grown to a thickness t approximately equal to or greater than $\sqrt{2}(n+1)d/|n-2|$.

In a more preferred embodiment, the aforementioned growth areas have a crystal orientation of [611] and the silicon carbide single crystals are grown to a thickness t approximately equal to or greater than $7\sqrt{2}d/4$.

In a preferred embodiment, a portion of the aforementioned growth areas are concave and another portion of these growth areas are convex.

In a preferred embodiment, the aforementioned growth areas are separated from each other by areas in which the crystallinity of the silicon single-crystal substrate is decreased by ion implantation situated between these growth areas.

In a preferred embodiment, the aforementioned growth areas are in the shape of circles or polygons including triangles.

In a preferred embodiment, the aforementioned growth areas have a crystal orientation inclined by an angle $\theta$ from the [100] direction toward the [011] and [0$\bar{1}$1] directions.

Thus, the invention described herein makes possible the objectives of (1) providing a method for the growth of silicon carbide single crystals, in which silicon carbide single crystals are grown on a silicon single-crystal substrate having growth areas with a specific crystal orientation to a prescribed thickness, so that these silicon carbide single crystals are substantially free of defects such as stacking faults and have excellent crystal quality; (2) providing a method for the growth of silicon carbide single crystals, in which a silicon single-crystal substrate having growth areas with a crystal orientation inclined from the [100] direction toward the [0$\bar{1}$1] or [011] direction is used as a crystal growth substrate, so that high quality silicon carbide single crystals substantially free of defects such as stacking faults can be grown on the elongated growth areas of the silicon single-crystal substrate without encountering any problem of antiphase boundaries; (3) providing a method for the growth of silicon carbide single crystals, in which a silicon single-crystal substrate having growth areas with a crystal orientation inclined from the [100] direction toward the [011] and [0$\bar{1}$1] directions is used as a crystal growth substrate, so that high quality silicon carbide single crystals of desired size, substantially free of defects such as stacking faults, can be grown on the growth areas of the silicon single-crystal substrate without encountering any problem of antiphase boundaries; and (4) providing a method for the growth of silicon carbide single crystals, by which silicon carbide semiconductor devices can be produced at any desired position on a silicon single-crystal substrate.

BRIEF DESCRIPTION OF THE DRAWINGS

This invention may be better understood and its numerous objects and advantages will become apparent to those skilled in the art by reference to the accompanying drawings as follows:

FIG. 4b is an enlarged view showing the vertical section and the top surface of any three of the growth areas of FIG. 4a.

DETAILED DESCRIPTION OF THE INVENTION

When silicon carbide single crystals are grown on a silicon single-crystal substrate, a number of stacking faults are distributed on the {111} planes of these single crystals. Such stacking faults have developed on the faces of a regular octahedron which has its one vertex on the interface between the silicon single-crystal substrate and the grown layer of silicon carbide single crystals.

Figure 2:
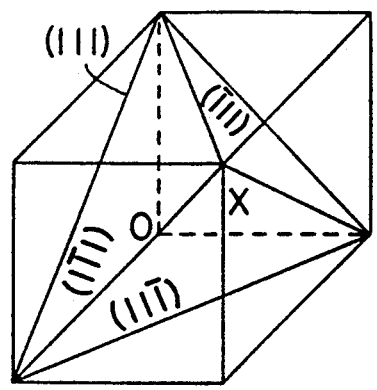
FIG. 2 is a perspective view showing a regular tetrahedron which is formed by stacking faults on the {111} planes of silicon carbide single crystals.

On the surface of the grown layer of silicon carbide single crystals, there appear some defect patterns, each of which has a shape corresponding to a certain section of the regular octahedron. For example, when an Si(100) substrate is used, these defect patterns take the shape of squares. In contrast, when an Si(111) substrate is used, stacking faults are assembled on the faces of a regular tetrahedron, as shown in FIG. 2. Therefore, the aforementioned defect patterns take the shape of regular triangles, each of which corresponds to the section of the regular tetrahedron cut off at the surface of the grown layer of silicon carbide single crystals.

As can be seen from FIG. 2, the regular tetrahedron has the following structure. The bottom face thereof corresponds to the (111) plane on the surface of the grown layer, the point 0 being taken as the origin; the vertex X thereof exists on the surface of the substrate; and the faces thereof consist of {111} planes. This is referred to as a "stacking-fault regular tetrahedron". Each of the {111} planes constituting the side faces of the regular tetrahedron meets at an angle of about 70°32' with the surface of substrate.

In general, the stacking faults develop on the faces of either the regular octahedron or the regular tetrahedron set forth above, and therefore, the defect patterns which will appear on the surface of the grown layer become larger with an increase in the thickness of the grown layer of silicon carbide single crystals. If there is no effect of the stacking faults which develop toward the grown layer of silicon carbide single crystals on the growth area of interest from other growth areas, the region of silicon carbide single crystals substantially free of defects will expand with an increase in the thickness of the grown layer.

Therefore, by limitation of the growth areas to a specific size, it is possible to prevent the stacking faults generated in the other growth areas from entering the grown layer of silicon carbide single crystals on the growth areas of interest. When silicon carbide single crystals are grown in the growth areas to a certain thickness greater than the prescribed thickness, stacking faults will be eliminated from the surface of the grown layer of silicon carbide single crystals.

Figure 1A:
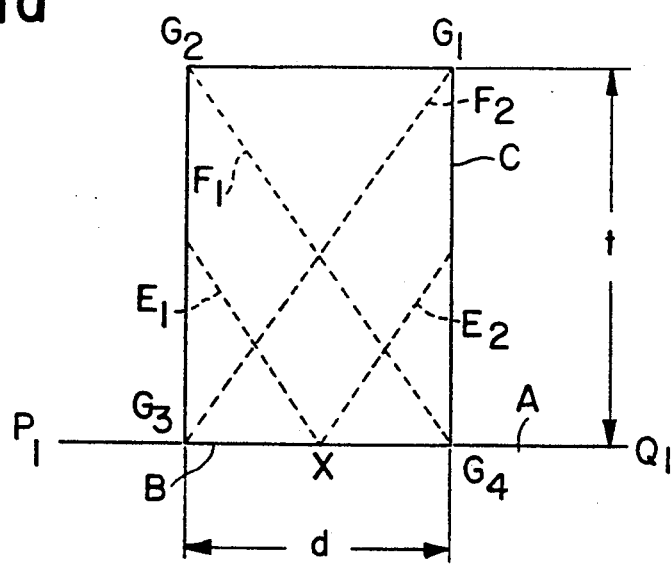
FIGS. 1a and 1b are schematic diagrams showing the principle of eliminating defects such as stacking faults from the grown layer of silicon carbide single crystals according to this invention.
Figure 1B:
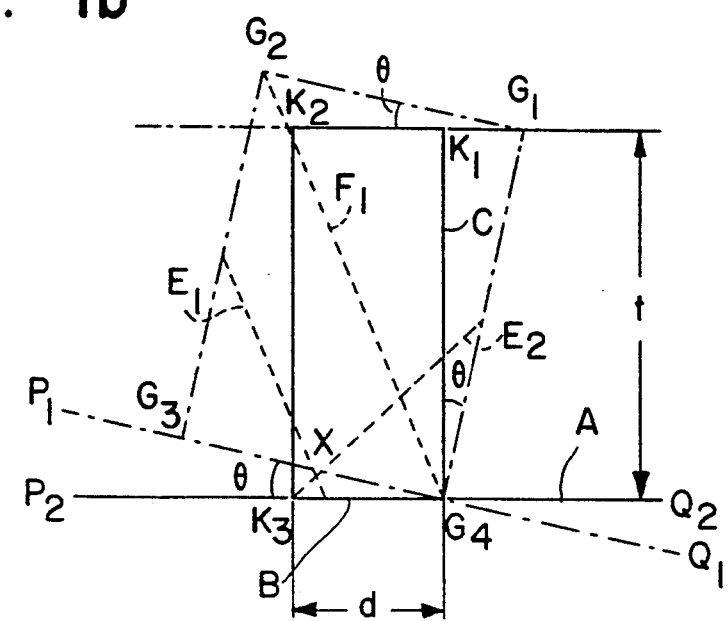

The principle that stacking faults can be eliminated from the grown layer of silicon carbide single crystals will hereinafter be explained by reference to FIGS. 1a and 1b.

First, the following will describe the case where silicon single-crystal substrates having a crystal growth plane with a crystal orientation of [100] (i.e., Si(100) substrates) are used. As shown in FIG. 1a, the growth area B having a width d is provided on the crystal growth plane $P_1Q_1$ of the silicon substrate A. The direction along the straight line segment $\overline{P_1Q_1}$ corresponds to the [011] direction. Therefore, the growth area B also has a crystal orientation of [100] and the width d of the growth area B is taken as the lateral dimension d.

In the growth area B, silicon carbide single crystals are grown to a thickness t, resulting in a grown layer C of silicon carbide single crystals. In this case, the stacking faults are assembled into a quadrangular pyramid with the vertex X thereof existing on the surface of the silicon substrate A and the side faces thereof consisting of the {111} planes around this vertex. The stacking faults $E_1$ and $E_2$ shown in FIG. 1a correspond to the side faces of this quadrangular pyramid, and when the thickness of the grown layer C is small, these stacking faults appear on the surface $G_1G_2$ of the grown layer C as defect patterns in the shape of squares. Each of the {111} planes constituting the side faces of the quadrangular pyramid meets at an angle of about 54°44' with the crystal growth plane $P_1Q_1$ of the silicon substrate A.

Since the crystal growth plane $P_1Q_1$ of the silicon substrate A is the (100) plane, there is a tendency of the (100) plane, which is one of the natural faces of silicon carbide single crystals, to appear on the surface $G_1G_2$ of the grown layer C. Therefore, the orientation of the surface $G_1G_2$ will also be [100].

For the purpose of eliminating all the stacking faults from the surface $G_1G_2$ of the grown layer C, other stacking faults $F_1$ and $F_2$ developing from the end portions of the growth area B should be eliminated. As can be seen from FIG. 1a, this elimination can be achieved by taking the thickness t of the grown layer C as a value of the lateral dimension d of the growth area B multiplied by a factor $\sqrt{2}$ ($\approx \tan(54°44')$). That is, the thickness t of silicon carbide single crystals to be grown in the growth area B is a value of $\sqrt{2}$d. Once the thickness of the growth layer C exceeds this value, the stacking faults can entirely be eliminated from the surface of the grown layer C after that.

Next, the following will describe the case where silicon single-crystal substrates having a crystal growth plane with a crystal orientation inclined from the [100] direction toward the [011] direction by an angle $\theta$ are used. As shown in FIG. 1b, the growth area B having a width d is provided on the crystal growth plane $P_2Q_2$ of the silicon substrate A. The crystal growth plane $P_2Q_2$ intersects the straight line segment $\overline{P_1Q_1}$ at an angle $\theta$. The direction along the straight line segment $\overline{P_1Q_1}$ corresponds to the [011] direction and the direction along the straight line segment $\overline{P_2Q_2}$ is referred herein to as the direction of inclination of the crystal growth plane $P_2Q_2$. Therefore, the growth area B also has a crystal orientation inclined from the [100] direction toward the [011] direction by an angle $\theta$ and the width d of the growth area B is taken as the lateral dimension d.

In the growth area B, silicon carbide single crystals are grown to a thickness t, resulting in a grown layer C of silicon carbide single crystals. In this case, the stacking faults $E_1$ and $E_2$ develop on the {111} planes. The stacking faults $E_1$ and $F_1$ shown in FIG. 1b meet with the crystal growth plane $P_2Q_2$ at an angle greater than that of the stacking fault $E_2$.

Therefore, when the growth of silicon carbide single crystals is carried out with the use of the limited growth areas, the stacking faults $E_1$ and $F_1$ appear readily on the surface $K_1K_2$ of the grown layer C, whereas the stacking fault $E_2$ is readily eliminated from the surface $K_1K_2$ of the grown layer C. For the purpose of eliminating all the stacking faults from the surface $K_1K_2$ of the grown layer C, the stacking fault $F_1$ developing from the end portion of the growth area B should be eliminated. As can be seen from FIG. 1b, this elimination can be achieved by growing silicon carbide single crystals to a certain thickness t which will be determined below.

Now, let the point $G_1$ be the origin, and let x-axis be taken along the straight line segment $G_1G_2$, y-axis along the straight line segment $G_1G_4$. The positive values for co-ordinate x are measured to the right on the x-axis, negative values to the left. The positive values for co-ordinate y are measured upward on the y-axis, negative values downward.

The equations for the straight lines $K_1K_2$ and $K_2G_4$ are $y = x \cdot \tan\theta$ and $y = -\sqrt{2}x - t/\cos\theta$, respectively. The co-ordinates (x,y) of the point $K_2$ can be easily obtained from these equations as follows:

$$(x, y) = \left( \frac{-t/\cos\theta}{\sqrt{2} + \tan\theta}, \frac{-t \cdot \tan\theta/\cos\theta}{\sqrt{2} + \tan\theta} \right)$$

With the use of the co-ordinates (x,y) of the point $K_2$, the distance between the points $G_1$ and $K_2$, that is, the length of the straight line segment $G_1K_2$ is given by the expression:

$$G_1K_2 = \left\{ \left( \frac{-t/\cos\theta}{\sqrt{2} + \tan\theta} \right)^2 + \left( \frac{-t \cdot \tan\theta/\cos\theta}{\sqrt{2} + \tan\theta} \right)^2 \right\}^{\frac{1}{2}}$$

Since $K_1K_2 = d = G_1K_2 - t \cdot \tan\theta$, the lateral dimension d can be calculated from this expression as follows:

$$d = \left| \frac{t/\cos^2\theta}{\sqrt{2} + \tan\theta} - t \cdot \tan\theta \right|$$

$$= \frac{|1 - \sqrt{2}\tan\theta|t}{\sqrt{2} + \tan\theta}$$

That is, the thickness t of silicon carbide single crystals to be grown in the growth area B is a value of $(\sqrt{2}+\tan\theta)d/|1-\sqrt{2}\tan\theta|$, with the proviso that the angle $\theta$ is not equal to $\tan^{-1}(\sqrt{2}/2)$. Once the thickness of the growth layer C exceeds this value, the stacking faults can entirely be eliminated from the surface of the grown layer C after that.

As used herein, the symbol $|x|$ represents the absolute value of x. The symbol $\tan^{-1}x$ represents the arc tangent of x in degrees, that is, if $\theta=\tan^{-1}x$, $x=\tan\theta$. For example, $\tan^{-1}(\sqrt{2})$ is approximately equal to 54°44'.

In particular, when the angle $\theta$ is equal to $\tan^{-1}(\sqrt{2}/n)$ degrees, the thickness t obtained above can be reduced to the expression $\sqrt{2}(n+1)d/|n-2|$ (where n is an integer of from 1 to 8, with the proviso that n is not equal to 2), because $\tan\theta$ is $\sqrt{2}/n$. This is the expression of the thickness t in the case where growth areas provided on a silicon single-crystal substrate have a crystal orientation corresponding to the (n11) plane, in other words, where an Si(n11) substrate is used. For specific examples, when n is equal to 1, the thickness t becomes $2\sqrt{2}d$, and when n is equal to 6, the thickness t becomes $7\sqrt{2}d/4$.

In this case, when the thickness of the grown layer C is small, defect patterns on the surface of the grown layer C take the shape of trapezoids. The upper and lower sides of these trapezoids correspond to the stacking faults $F_1$ and $E_2$, respectively. These sides of the trapezoids are perpendicular to the [011] direction. Therefore, if the shape of the growth area is taken as a polygon and if one of the sides of this polygon is set to be perpendicular to the [011] direction, silicon carbide single crystals substantially free of defects can be grown on the growth area which is elongated in the direction perpendicular to the [011] direction. Although only the case of Si(n11) substrate being used is described, silicon carbide single crystals substantially free of defects can generally be grown on the elongated growth area in a specific direction which is determined by the orientation of the crystal growth plane of the silicon substrate used.

Also, when the growth areas are provided on an Si(100) single-crystal substrate, silicon carbide single crystals grown in the growth areas may contain antiphase boundaries in some cases. Thus, it is difficult to produce semiconductor device elements at the desired position on the silicon substrate, thereby causing the production yield to decrease.

In contrast, when silicon carbide single crystals are grown on a silicon single-crystal substrate having growth areas with a crystal orientation inclined by a small angle from the [100] direction, it is possible to produce the semiconductor device elements at the desired position without encountering the problem as mentioned above.

However, the dimension of the resulting silicon carbide single crystals decreases in the direction of inclination of the crystal growth plane. For example, the surface of silicon carbide single crystals grown on the circular growth areas takes the shape of a rectangle which is narrow in the direction of such inclination and elongated in the direction perpendicular to such inclination. For the purpose of obtaining silicon carbide single crystals of the desired size, the lateral dimension of the growth areas must be set to be greater in the direction of inclination of the crystal growth plane than in the direction perpendicular to such inclination.

The reason for this is considered as follows. On the surface of the silicon single-crystal substrate having growth areas with a crystal orientation inclined by a small angle from the [100] direction, there are steps at atomic level in the direction of inclination of the crystal growth plane. When the silicon substrate is provided with a difference in level by an etching technique, these atomic steps appear on the edge portion and on the side faces of the growth areas. If silicon carbide single crystals are grown in these growth areas, the {111} planes of these crystals are easy to develop in the direction of such inclination but difficult to develop in the direction perpendicular to such inclination. Therefore, the surface of the resulting grown layer of silicon carbide single crystals has the dimension decreased in the direction of inclination of the crystal growth plane.

In the method of this invention, as described above, silicon single-crystal substrates which can be used have a crystal growth plane with a crystal orientation inclined from the [100] direction toward at least one of the [011] and [0$\bar{1}$1] directions by an angle $\theta$ in the range of zero to $\tan^{-1}(\sqrt{2}/8)$ degrees (with the proviso that the angle $\theta$ is not equal to $\tan^{-1}(\sqrt{2}/2)$ degrees). Specific examples include Si(100) substrates, Si(n11) substrates (where n is an integer equal to or greater than 1, preferably, in the range of from 1 to 8, with the proviso that n is not equal to 2), and "off-angle" substrates thereof. The "off-angle" substrates have a crystal growth plane with a crystal orientation further inclined from the [100] direction (in the case of "off-angle" Si(100) substrates) or from the [n11] direction (in the case of "off-angle" Si(n11) substrates) toward at least one of the [011] and [0$\bar{1}$1] directions by a small angle, preferably in the range of 0.1 to 10 degrees.

The shape of the growth areas is conveniently determined depending upon the shape, size, or the like of semiconductor device elements which will be produced later therein. The shape of the growth areas is usually taken as a circle or polygon including a triangle. The lateral dimension d of the growth areas is taken along the direction of inclination of the crystal growth plane toward the [011] or [0$\bar{1}$1] direction. Although the value of the lateral dimension d is usually set to be in the range of about 0.1 to 100 $\mu$m, the lateral dimension d can be made very fine with the use of a method for fine processing.

In cases where silicon single-crystal substrates having growth areas with a crystal orientation inclined by a small angle from the [100] direction toward the [011] direction are used, the lateral dimension d of the growth areas along the direction of such inclination is set to be greater than the lateral dimension of silicon carbide single crystals to be grown in the direction of such inclination, while the other lateral dimension in the direction perpendicular to such inclination is set to be approximately equal to the aforementioned lateral dimension of silicon carbide single crystals. Because silicon carbide single crystals have a diamond-like structure, the [011] direction of these crystals is equivalent to the [0$\bar{1}$1] direction thereof. Therefore, the excellent advantages of this invention can be equally attained by the use of silicon single-crystal substrates having growth areas with a crystal orientation inclined by a small angle from [100] direction to the [0$\bar{1}$1] direction.

When silicon carbide single crystals are grown on the silicon single-crystal substrate having growth areas with a crystal orientation inclined by a small angle from the [100] direction to the [011] or [0$\bar{1}$1] direction, the lateral dimension of the silicon carbide single crystals obtained is smaller in the direction of inclination of the crystal growth plane than in the direction perpendicular to such inclination. For example, the surface of the silicon carbide single crystals grown on the circular growth areas takes the shape of a rectangle which is narrow in the direction of such inclination and elongated in the direction perpendicular to such inclination.

Thus, for the purpose of obtaining silicon carbide single crystals of the desired size, it is desirable to set the dimension of the growth areas greater in the direction of inclination of the crystal growth plane than in the direction perpendicular to this inclination. Alternatively, with the use of a tendency that the surface of the silicon carbide single crystals grown has a narrow shape in the direction of such inclination, it is possible to improve the crystallinity of silicon carbide single crystals grown over the growth areas having an elongated shape in the direction perpendicular to such inclination.

In cases where silicon single-crystal substrates having growth areas with a crystal orientation inclined by a small angle from the [100] direction toward the [011] and [0$\bar{1}$1] directions are used, the dimension d of the growth areas is set to be approximately equal to the lateral dimension of silicon carbide single crystals to be grown, both in the direction of inclination of the crystal growth plane and in the direction perpendicular to such inclination.

In the method of this invention, the thickness t of silicon carbide single crystals to be grown depends upon the crystal orientation and lateral dimension d of the growth areas formed on the silicon single-crystal substrate which is used. The lateral dimension d of the growth areas, although taken along the direction of inclination of the crystal growth plane, is determined by the shape of the growth areas.

For example, when an Si(100) single-crystal substrate is used to form silicon carbide single crystals, there is a tendency of the (100) plane, which is one of the natural faces of silicon carbide single crystals, to appear on the surface of the grown layer of silicon carbide single crystals. Therefore, squares with each side being parallel to the [011] or [0$\bar{1}$1] direction are typically selected as the shape of the growth areas, in which case the length of one side of the squares is taken as the lateral dimension d. Alternatively, as the shape of the growth areas, circles can also be used, in which case a diameter of the circles is taken as the lateral dimension d.

As described above, the thickness t of silicon carbide single crystals to be grown in the growth areas can be expressed as a function of the lateral dimension d of the growth areas. Alternatively, a scale rule between the lateral dimension d of the growth areas and the thickness t of silicon carbide single crystals grown in the growth areas can be obtained empirically on the basis of the experimental values as described in the examples below. In some cases, the size of the surface of these crystals decreases with an increase in the thickness of silicon carbide single crystals.

On the basis of the fundamental principle set forth above, the method for the growth of silicon carbide single crystals is, for example, carried out as follows:

First, the shape, size, and crystal orientation of the growth areas to be formed on a silicon single-crystal substrate are selected.

Then, the growth areas for silicon carbide single crystals are formed on the substrate. To eliminate defects such as stacking faults developed from other areas, the growth areas are restricted in size, for example, by providing a difference in level between the growth areas and the adjacent growth areas thereto, or by disposing the growth areas dispersively. The growth areas can be directly formed on the silicon substrate. Alternatively, the growth areas may be provided on a silicon carbide single-crystal film formed on the silicon substrate. Unless otherwise indicated, the term substrate refers to a silicon single-crystal substrate or a silicon carbide single-crystal film formed on the silicon substrate. For the reduction of adverse effects caused by etching damage of the silicon substrate, it is useful to form a silicon single-crystal film on the silicon substrate after subjected to an etching treatment.

Examples of the method for providing a difference in level between the growth areas include various etching techniques such as plasma etching, reactive ion etching, chemical etching, and the like. As the size of the growth areas is decreased, the thickness of the silicon carbide single-crystal layer substantially free of defects becomes small. Therefore, when the substrate is provided with the concave and convex portions, the depth of the hollow portions or the height of the convex portions can be made small. Moreover, even in the concave portions of the substrate, stacking faults can be eliminated from the silicon carbide single crystals grown therein. If the successive growth is carried out, silicon carbide single crystals substantially free of defects can be obtained on the entire surface of the substrate. Thus, with the use of the resulting silicon carbide single crystals substantially free of defects as a substrate, silicon carbide semiconductor devices with excellent characteristics can be produced at any desired position on the substrate.

The growth areas can be disposed dispersively as follows; the substrate is irradiated with electron beams or ion beams, resulting in a decrease in the crystallinity of the irradiated areas of the substrate, so that the non-irradiated growth areas and the irradiated areas can be distinguished from each other on the basis of the difference in crystallinity therebetween. Alternatively, the substrate is coated with a noncrystalline film such as silicon oxide or silicon nitride, and then the portions of the non-crystalline film corresponding to the growth areas are moved by an etching technique. Because the crystallinity of silicon carbide crystals grown in areas other than the growth areas has been decreased, silicon carbide crystals grown in those areas are not in the form of single crystals. In contrast, silicon carbide single crystals can be grown in the growth areas. Thus, these growth areas are disposed dispersively.

As the method for providing atomic steps in the outer region of the growth areas formed on the substrate, there can be mentioned a thermal annealing technique or a chemical etching technique.

The substrate having the growth areas of a desired size is then subjected to the growth of silicon carbide single crystals thereon. Examples of the method for the growth of silicon carbide single crystals include various techniques such as chemical vapor deposition (CVD), liquid phase epitaxy (LPE), molecular beam epitaxy (MBE), and the like. Any of these techniques can be used to prepare silicon carbide single crystals substantially free of defects.

Figure 3:
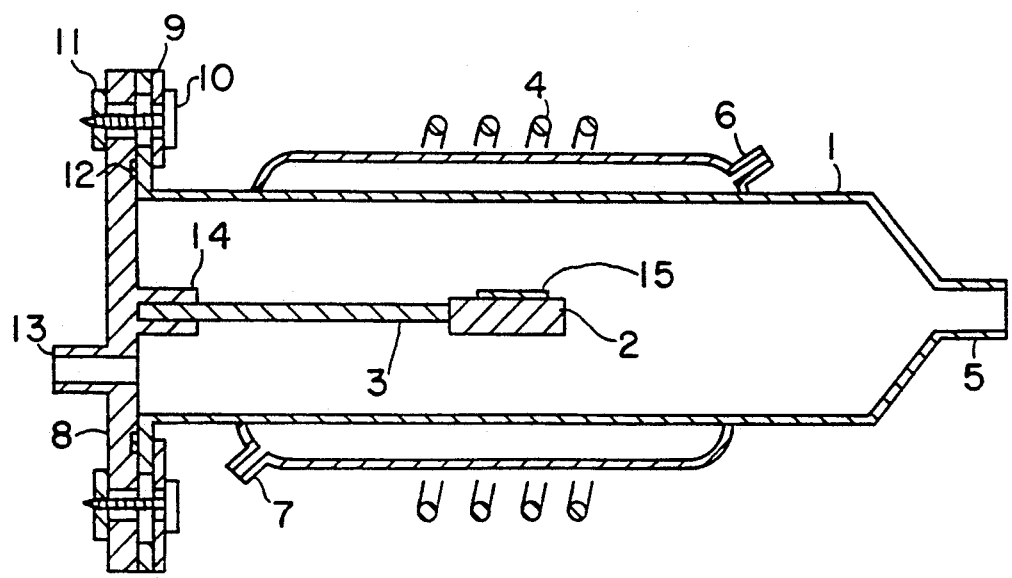
FIG. 3 is a sectional view showing an apparatus used for the growth of silicon carbide single crystals according to this invention.

The process for the growth of silicon carbide single crystals by chemical vapor deposition will be described hereinafter. FIG. 3 shows an apparatus used for the growth of silicon carbide single crystals. The apparatus comprises a water-cooled horizontal quartz double reactor tube 1 that is internally provided with a graphite susceptor 2 either horizontally or inclinationally supported by a graphite support rod 3. The reactor tube 1 is wound with a working coil 4, through which a radio-frequency current is passed to heat the susceptor 2 by induction. The reactor tube 1 has at its one end a branch tube 5 providing a gas inlet. Through branch tubes 6 and 7, cooling water is supplied to the interior of the outer tube of the reactor tube 1. The other end of the reactor tube 1 is sealed by a stainless steel flange 8, a holding plate 9, bolts 10, nuts 11, and an O-ring 12. The flange 8 has a branch tube 13 providing a gas outlet.

Optionally, the surface of the silicon substrate that has been provided with the growth areas may be covered with a very thin film of the silicon carbide single crystal. Using the above-mentioned apparatus, this film is formed as follows: The silicon single-crystal substrate 15 is placed on the susceptor 2. While a carbon source gas and a carrier gas are fed to the reactor tube 1 through the branch tube 5, a radiofrequency current is passed through the working coil 4 to heat the susceptor 2 and raise the temperature of the silicon single-crystal substrate 15 to a given temperature. The temperature of the substrate is maintained for a given period of time, thereby carbonizing the surface of the silicon single-crystal substrate 15, resulting in a thin film of the silicon carbide single crystal on the substrate.

For the carbonization of the surface of the silicon single crystal substrate 15, $CH_4$, $C_2H_6$, $C_3H_8$, or the like can be used as the carbon source gas; and hydrogen, argon, or the like can be used as the carrier gas. The period of time for the formation of the thin film of silicon carbide single crystals depends upon the temperature of the substrate, and the flow rates of the carbon source gas and carrier gas. Usually, the carbon source gas is fed to the reactor tube 1 at a rate of 0.1 to 1.0 cc/min., and the carrier gas at a rate of 1 to 5 liters/min. The substrate is heated to a temperature in the range of about 1,200° C. to 1,400° C., at which temperature the thin film of silicon carbide single crystals can be formed in about 1 to 5 minutes.

Finally, on the untreated silicon single-crystal substrate, or when the surface of the silicon substrate has been treated by carbonization, on the thin film of silicon carbide single crystals overlying the silicon substrate, silicon carbide single crystals are grown in the same manner as described above. At that time, a silicon source gas, in addition to a carbon source gas and a carrier gas, is fed to the reactor tube 1. As the silicon source gas, $SiH_4$, $SiCl_4$, $SiH_2Cl_2$, $(CH_3)_3SiCl$, $(CH_3)_2SiCl_2$, or the like can be used. The flow rate of the silicon source gas is usually set to be in the range of 0.1 to 1.0 cc/min. The kinds and flow rates of the carbon source gas and carrier gas as well as the temperature of the heated substrate can be set to be the same as defined above. The period of time for the growth of the silicon carbide single-crystal layer should be set to yield the desired layer thickness.

The silicon carbide single crystals obtained in the above process can be used together with the underlying silicon single-crystal substrate as a semiconductor material. Alternatively, prior to the use of the silicon carbide single crystals, the silicon single-crystal substrate may be removed by an etching technique or the like.

The defect-free silicon carbide single crystals of this invention can be used to produce semiconductor devices such as field effect transistors (FETs), complementary metal-oxide-semiconductor (C-MOS) devices and the like. If the silicon carbide single crystals in the growth areas are used for semiconductor device elements and the other areas are used for the supply of electric power, then semiconductor devices with excellent characteristics can be produced. With the use of a method for fine processing, the growth areas may be provided to have a hyperfine pattern, and a single semiconductor device element can be formed over a plurality of the growth areas, resulting in a semiconductor device. In this case, if the surface of the silicon carbide single crystal is polished up by an etching technique after the step of growing, then even more excellent results can be obtained.

DESCRIPTION OF THE PREFERRED EMBODIMENTS

The invention will be further described by reference to the following examples.

Example 1

An Si(100) single-crystal substrate was used as a crystal growth substrate. On the crystal growth plane of the silicon single-crystal substrate, patterns of growth areas with a lateral dimension d of 0.1 μm were drawn at a distance of 0.1 μm therebetween in a parallel manner by an electron beam etching technique. The thickness t of silicon carbide single crystals to be grown in these growth areas was about 0.14 μm. Therefore, the growth areas were provided with a difference in level therebetween by 0.14 μm using a reactive ion etching technique.

Then, the surface of the silicon single-crystal substrate provided with the growth areas was carbonized to form a very thin film of the silicon carbide single crystal. This treatment was carried out as mentioned above with the use of the apparatus shown in FIG. 3. Propane ($C_3H_8$) gas as a carbon source gas was fed to the reactor tube 1 at a rate of 0.5 cc/min. and hydrogen ($H_2$) gas as a carrier gas at a rate of 3 liters/min. The silicon single-crystal substrate 15 was heated to a temperature of 1,300° C.

Following the formation of the silicon carbide single-crystal film, the growth of silicon carbide single crystals was carried out by chemical vapor deposition. In addition to the propane gas and the hydrogen gas, monosilane ($SiH_4$) gas as a silicon source gas was fed to the reactor tube 1 at a rate of 0.5 cc/min. The silicon single-crystal substrate 15 was also heated to a temperature of 1,300° C. Under these conditions, a silicon carbide single-crystal layer with a thickness of 0.14 μm was obtained in 3 minutes. The resulting silicon carbide single crystal layer was observed by the use of a transmission electron microscope, and it was found that stacking faults were significantly reduced over the entire surface of the silicon carbide single-crystal layer. In other words, the resulting silicon carbide single-crystal layer was substantially free of defects such as stacking faults.

The subsequent growth of the silicon carbide single-crystal layer was carried out for 30 minutes under the same conditions as described above. The resulting silicon carbide single crystals were used to produce C-MOS devices with a gate length of 3 μm, which exhibited excellent characteristics.

Example 2

An Si(100) single-crystal substrate was used as a crystal growth substrate. On the crystal growth plane of the silicon single-crystal substrate, octagonor round-shaped patterns of growth areas with a lateral dimension d of 20 μm were formed by photolithography. When the growth areas were in the shape of an octagon, the lateral dimension d was set to be a distance between the two opposite sides of this octagon. When the growth areas were in the shape of a circle, the lateral dimension d was set to be a diameter of this circle.

Then, with the use of an ion implantation method, P+ ions were implanted in the peripheral region around the growth areas, thereby decreasing the crystallinity of the silicon substrate in the peripheral region. As the conditions used for the ion implantation, the accelerating potential was 100 keV and the dose of P+ ion was $1 \times 10^{15}$ cm$^{-2}$.

On the silicon substrate provided with the growth areas dispersively, silicon carbide single crystals were grown in the same manner as in Example 1. In this case, the thickness t of the silicon carbide single crystals to be grown was 28 μm. Under the same conditions as in Example 1, the silicon carbide single crystals with a thickness of 28 μm were obtained in 8 hours.

The resulting silicon carbide single crystals were observed by the use of a transmission electron microscope, and it was found that only silicon carbide crystals grown in the growth areas were in the form of a single crystal, and that silicon carbide crystals grown in the peripheral region had reduced crystallinity. Moreover, it was also found that stacking faults were significantly reduced on the surface of the silicon carbide single crystals grown in the growth areas, indicating that stacking faults generated in the peripheral region could not develop toward the growth areas. In other words, the resulting silicon carbide single crystals were substantially free of defects such as stacking faults.

Example 3

In the same manner as in Example 2, silicon carbide single crystals were grown on the crystal growth plane of an Si(100) single-crystal substrate, except that the growth areas were provided with a difference in level therebetween by 1 μm using a chemical etching technique. The etchant used for the etching treatment was an aqueous solution of potassium hydroxide (KOH).

The resulting silicon carbide single crystals were observed by the use of a transmission electron microscope, and it was found that stacking faults were reduced over the entire surface of the silicon carbide single-crystal layer. In other words, the resulting silicon carbide single crystals were substantially free of defects such as stacking faults.

Example 4

An Si(100) single-crystal substrate was used as a crystal growth substrate. On the crystal growth plane of the silicon single-crystal substrate, a silicon nitride (SiN) film with a thickness of 0.5 μm was formed by plasma chemical vapor deposition. Then, the patterns of the same growth areas as in Example 2 were provided by photolithography. The portions of the silicon nitride film corresponding to the growth areas were removed by a chemical etching technique, resulting in a difference in level between the growth areas and the peripheral region.

On the above-mentioned silicon substrate which had been provided with dispersed growth areas and had a difference in level between the growth areas and the peripheral region, silicon carbide single crystals were grown in the same manner as in Example 2.

The resulting silicon carbide single crystals were observed by the use of a transmission electron microscope, and it was found that only silicon carbide crystals grown on the growth areas were in the form of a single crystal and that silicon carbide crystals grown on the peripheral region had reduced crystallinity. Moreover, it was also found that stacking faults were reduced on the surface of the silicon carbide single crystals grown on the growth areas, indicating that stacking faults generated in the peripheral region could not develop toward the growth areas. In other words, the resulting silicon carbide single crystals were substantially free of defects such as stacking faults.

Example 5

An Si(611) single-crystal substrate was used as a crystal growth substrate. On the crystal growth plane of the silicon single-crystal substrate, rectangle-shaped patterns of growth areas were formed by a reactive ion etching technique. These growth areas had a width of 30 μm in the direction of inclination of the crystal growth plane toward the [011] direction and a length of 10 μm in the direction perpendicular to such inclination, in which case the lateral dimension d of the growth areas was 30 μm.

On the above-mentioned silicon substrate provided with dispersed growth areas, silicon carbide single crystals with a thickness of 74 μm were grown in the same manner as in Example 1.

The resulting silicon carbide single crystals were subjected to thermal oxidation at 1,100° C. for 3 hours, resulting in a silicon oxide (SiO$_2$) film with a thickness of 0.05 μm on the surface thereof. Then, B+ ions were implanted in the silicon carbide single crystals at the accelerating potentials of 100 keV and 30 keV to form channel regions of n-type FETs as well as source and drain regions of p-type FETs. Thereafter, source and drain regions of the n-type FETs were formed by ion implantation of P+ ions. Finally, appropriate portions of the SiO$_2$ film were removed by photolithography and then the upper face of the SiO$_2$ film including the removed portions was subjected to a vapor deposition treatment with aluminum (Al) using an appropriate mask, resulting in electrodes. In this way, C-MOS devices were formed in the silicon carbide single crystals grown on the growth areas.

The obtained C-MOS devices on the respective growth areas were connected to each other in order by the use of an aluminum (Al) metal, resulting in an 11th-order ring oscillator. The ring oscillator was measured for its oscillation frequency to give 5.0 MH$_z$. Therefore, the propagation delay time of each C-MOS device was about 10 nsec, indicating that the semiconductor device prepared from the silicon carbide single crystals of this invention exhibited excellent characteristics.

Example 6

This example discloses the growth of silicon carbide single crystals, the surface of which is in the shape of a square with a size of 20 μm ×20 μm.

As a crystal growth substrate, a silicon single-crystal substrate was used, the crystal growth plane thereof being inclined from the [100] direction toward the [011] direction at an angle of 2 degrees. On the crystal growth plane of the silicon single-crystal substrate, patterns of growth areas were drawn at a predetermined distance therebetween in a parallel manner by an electron beam etching technique. These growth areas had a width of 40 μm in the direction of inclination of the crystal growth plane and a length of 20 μm in the direction perpendicular to such inclination, in which case the lateral dimension d of the growth areas was 40 μm. Thereafter, there was provided a difference in level by 1 μm between the growth areas and the other areas using a reactive ion etching technique.

Then, the surface of the silicon single-crystal substrate provided with the growth areas was carbonized to form a very thin film of silicon carbide single crystals. This treatment was carried out as mentioned above with the use of the apparatus shown in FIG. 3. Propane ($C_3H_8$) gas as a carbon source gas was fed to the reactor tube 1 at a rate of 0.5 cc/min. and hydrogen ($H_2$) gas as a carrier gas at a rate of 3 liters/min. The silicon single-crystal substrate 15 was heated to a temperature of 1,300° C.

Following the formation of the silicon carbide single-crystal film, the growth of silicon carbide single crystals was carried out by chemical vapor deposition. In addition to the propane gas and the hydrogen gas, monosilane ($SiH_4$) gas as a silicon source gas was fed to the reactor tube 1 at a rate of 0.5 cc/min. The silicon single-crystal substrate 15 was also heated to a temperature of 1,300° C. Although the thickness t required for obtaining defect-free silicon carbide single crystals was about 61 μm, the growth to a thickness of only about 25 μm gave silicon carbide single crystals with a surface area of 20 μm ×20 μm, which were substantially free of defects. Under the conditions mentioned above, silicon carbide single crystals with a thickness of 25 μm were obtained in 8 hours. The growth of silicon carbide single crystals was continued until the thickness of the grown layer reached about 61 μm or greater; however, no stacking faults appeared on the surface of the grown layer.

The silicon carbide single crystals with a surface area of 20 μm ×20 μm obtained as described above were used to produce C-MOS devices with a gate length of 3 μm, which exhibited excellent characteristics.

For the comparison with this example, the same silicon single-crystal substrate as mentioned above was provided with growth areas in the shape of a square with a size of 30 μm ×30 μm, and then subjected to the growth of silicon carbide single crystals. Under the same conditions as mentioned above, silicon carbide single crystals substantially free of defects were obtained, the surface of which was in the shape of a rectangle with a width of 15 μm in the direction of inclination of the crystal growth plane and a length of 30 μm in the direction perpendicular to such inclination. Even when the growth of silicon carbide single crystals was continued until the thickness of the grown layer reached about 46 μm or greater, which was calculated from the thickness requirements of this invention, no stacking faults appeared on the surface of the grown layer.

Example 7

This example discloses the growth of silicon carbide single crystals, the surface of which is in the shape of an elongated rectangle with a size of 20 μm ×500 μm.

The silicon carbide single crystals were grown in the same manner as in Example 6, except that the growth areas with a width of 40 μm in the direction of inclination of the crystal growth plane and a length of 500 μm in the direction perpendicular to such inclination, in which case the lateral dimension d of the growth areas was 40 μm. The thickness t required for obtaining defect-free silicon carbide single crystals was 61 μm; however, the growth to a thickness of only about 25 μm was necessary for obtaining silicon carbide single crystals with a surface area of 20 μm ×500 μm, which were substantially free of defects. Under the same conditions as in Example 6, silicon carbide single crystals with a thickness of 25 μm were obtained in 8 hours. Even when the growth of silicon carbide single crystals was continued until the thickness of the grown layer reached about 61 μm or greater, which was calculated from the thickness requirements of this invention, no stacking faults appeared on the surface of the grown layer.

The silicon carbide single crystals with a surface area of 20 μm ×500 μm obtained as mentioned above were used to produce C-MOS devices with a gate length of 3 μm, which exhibited excellent characteristics.

Example 8

This example discloses the growth of silicon carbide single crystals substantially free of defects over the wide growth areas on a silicon single-crystal substrate.

As a crystal growth substrate, the same silicon single-crystal substrate as in Example 6 was used, the crystal growth plane thereof being inclined from the [100] direction toward the [011] direction at an angle of 2 degrees. On the crystal growth plane of the silicon single-crystal substrate, patterns of growth areas were drawn at a distance of 10 μm therebetween in a parallel manner by an electron beam etching technique. These growth areas with a width of 40 μm in the direction of inclination of the crystal growth plane and a length of 500 μm in the direction perpendicular to such inclination, in which case the lateral dimension d of the growth areas was 40 μm. Thereafter, there was provided a difference in level by 1 μm between the growth areas and the other areas using a reactive ion etching technique.

Under the same conditions as in Example 6, the growth of silicon carbide single crystals was carried out by chemical vapor deposition. The silicon carbide single crystals substantially free of defects were grown on the top surface of each convex portion and even on the bottom surface of each hollow portion.

Although the thickness t required for obtaining defect-free silicon carbide single crystals was 61 μm, the growth to a thickness of only about 25 μm was necessary for obtaining silicon carbide single crystals with a surface area of 20 μm ×500 μm, which were substantially free of defects. Even when the growth of silicon carbide single crystals was continued until the thickness of the grown layer reached about 61 μm or greater, no stacking faults appeared on the surface of the grown layer.

Moreover, when many growth areas such as those mentioned above were repeatedly formed in a parallel manner on the silicon single-crystal substrate, the portions of the substrate, on which silicon carbide single crystals substantially free of defects were grown, could also extend toward the direction of inclination of the crystal growth plane of the substrate. For example, it was possible to improve the crystallinity of silicon carbide single crystals grown over wide growth areas measuring 500 μm ×500 μm.

Example 9

This example discloses the growth of silicon carbide single crystals, the surface of which is in the shape of a square with a size of 20 μm × 20 μm.

Figure 4A:
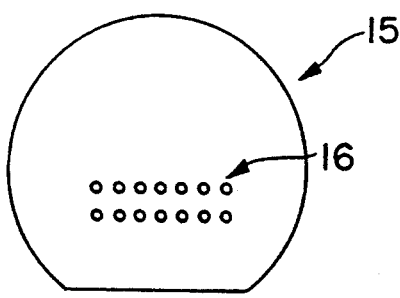
FIG. 4a is a top plan view showing a silicon carbide single-crystal substrate provided with several circular growth areas for use in Example 9 of this invention.
Figure 4B:
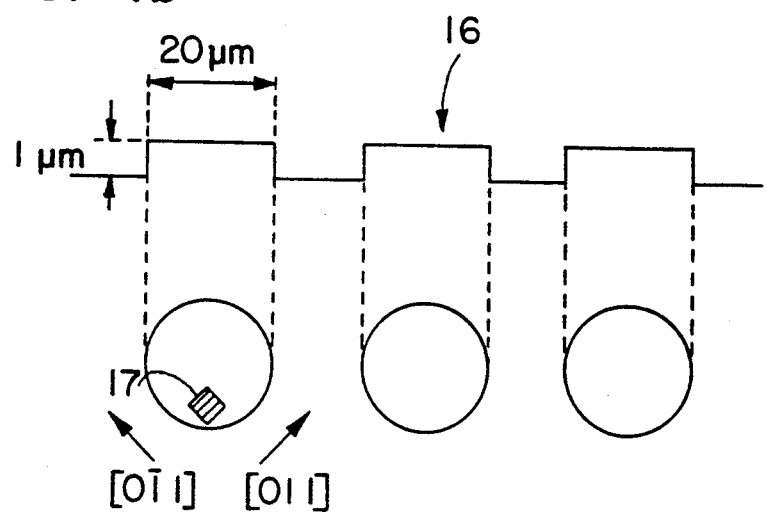
Figure 4C:
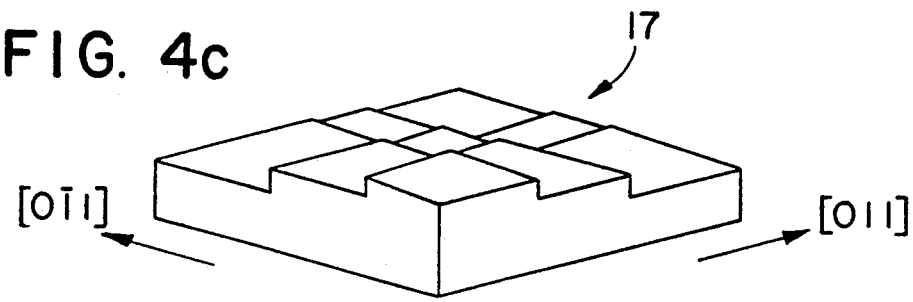
FIG. 4c is a perspective enlarged view showing the hatched portion of FIG. 4b.

As a crystal growth substrate, a silicon single-crystal substrate 15 shown in FIG. 4a was used, the crystal growth plane thereof being inclined from the [100] direction to the [011] and [0$\bar{1}$1] directions at an angle of 2 degrees, respectively. On the crystal growth plane of the silicon single-crystal substrate, patterns of growth areas 16 were drawn at a predetermined distance therebetween in a parallel manner by an electron beam etching technique. These growth areas 16 were in the shape of a circle with a diameter of 20 μm, in which case the lateral dimension d of the growth areas was 20 μm. Thereafter, there was provided a difference in level by 1 μm between the growth areas 16 and the other areas, as shown in FIG. 4b, using a reactive ion etching technique. On the edge portion 17 of each growth area 16, as shown in FIG. 4c, there appeared atomic steps along the [011] and [0$\bar{1}$1] directions.

Then, the surface of the silicon single-crystal substrate 15 provided with the growth areas was carbonized to form a very thin film of silicon carbide single crystals. This treatment was carried out as mentioned above with the use of the apparatus shown in FIG. 3. Propane ($C_3H_8$) gas as a carbon source gas was fed to the reactor tube 1 at a rate of 0.5 cc/min. and hydrogen ($H_2$) gas as a carrier gas at a rate of 3 liters/min. The silicon single-crystal substrate 15 was heated to a temperature of 1,300° C.

Following the formation of the silicon carbide single-crystal film, the growth of silicon carbide single crystals was carried out by chemical vapor deposition. In addition to the propane gas and the hydrogen gas, monosilane ($SiH_4$) gas as a silicon source gas was fed to the reactor tube 1 at a rate of 0.5 cc/min. The silicon single-crystal substrate 15 was also heated to a temperature of 1,300° C. Although the thickness t required to form defect-free silicon carbide single crystals was about 30 μm, the growth to a thickness of only about 25 μm gave silicon carbide single crystals with a surface area of 20 μm × 20 μm, which were substantially free of defects, on the surface of each growth area 16. Under the conditions mentioned above, silicon carbide single crystals with a thickness of 25 μm were obtained in 8 hours. The growth of silicon carbide single crystals was continued until the thickness of the grown layer reached about 30 μm or greater; however, no stacking faults appeared on the surface of the grown layer.

The silicon carbide single crystals with a surface area of 20 μm × 20 μm were used to produce C-MOS devices with a gate length of 3 μm, which exhibited excellent characteristics.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the growth of silicon carbide single crystals, said method comprising the preparation of a silicon single crystal substrate having growth areas and the step of growing silicon carbide single crystals on the growth areas with a thickness approximately equal to a more than critical thickness t, said growth areas having a crystal orientation inclined by an off angle $\theta$ from the [100] direction toward the [011] or [0$\bar{1}$1] direction and said off angle $\theta$ being smaller than 10° (ten degrees) (with the proviso that the angle $\theta$ is not equal to tan ($\sqrt{2}/2$) degrees), said critical thickness t being approximately equal to $d(\sqrt{2}+\tan\theta)/|1-\sqrt{2}\tan\theta|$ for said off angle $\theta$ and a lateral dimension d, said lateral dimension d being specified by rectangular coordinates attached onto said growth area, the two axes of said rectangular coordinates being taken parallel and perpendicular to [0$\bar{1}$1] in case of an off angle $\theta$ toward [011], or the two axes of said rectangular coordinates being taken parallel and perpendicular to [011] in case of an off angle $\theta$ toward [0$\bar{1}$1], said lateral dimension d being equal to the length of said growth area along said axis perpendicular to [011] in case of an off angle $\theta$ toward [0$\bar{1}$1], or said lateral dimension d being equal to the length of said growth area along said axis perpendicular to [011] in case of an off angle $\theta$ toward [011], and said lateral dimension d being in the range of 0.1 to 100 μm.

2. A method for the growth of silicon carbide single crystals according to claim 1, wherein said off angle $\theta$ is equal to $\tan^{-1}(\sqrt{2}/n)$ from the [100] direction toward the [011] direction, said critical thickness t being approximately equal to $\sqrt{2}d(n+1)/|n-2|$ (where n is an integer of from 1 to 8, with proviso that it is not equal to 2).

3. A method for the growth of silicon carbide single crystals, said method comprising the preparation of a silicon single crystal substrate having growth areas and the step of growing silicon carbide single crystals on the growth areas with a thickness approximately equal to or more than a critical thickness t, said growth areas having a crystal orientation of [100], said critical thickness t being approximately equal to $\sqrt{2}d$ for a lateral dimension d, said lateral dimension d being specified by rectangular coordinates attached onto said growth area, the two axes of said rectangular coordinates being taken parallel to [011] and [0$\bar{1}$1], said lateral dimension d being equal to the longer one of the length of said growth area along said axes, and said lateral dimension d being in the range of 0.1 to 100 μm.

4. A method for the growth of silicon carbide single crystals, said method comprising the preparation of a silicon single crystal substrate having growth areas and the step of growing silicon carbide single crystals on the growth areas with a thickness approximately equal to or more than a critical thickness t, said growth areas having a crystal orientation inclined by an off angle $\theta$ from the [100] direction toward the [011] or [0$\bar{1}$1] direction and said off angle $\theta$ being smaller than 10° (ten degrees) (with the proviso that the angle $\theta$ is not equal to tan ($\sqrt{2}/2$) degrees), said critical thickness t being approximately equal to $d(\sqrt{2}+\tan\theta)/|1-\sqrt{2}\tan\theta|$ for said off angle $\theta$ and a lateral dimension d, said lateral dimension d being specified by rectangular coordinates attached onto said growth area, the two axes of said rectangular coordinates being taken parallel and perpendicular to [0$\bar{1}$1] in case of an off angle $\theta$ toward [011], or the two axes of said rectangular coordinates being taken parallel and perpendicular to [011] in case of an off angle $\theta$ toward [0$\bar{1}$1], said lateral dimension d being equal to the length of said silicon carbide single crystal grown on said growth area along said axes perpendicular to [0$\bar{1}$1] in case of an off angle $\theta$ toward [011], or said lateral dimension d being equal to the length of said silicon carbide single crystal grown on said growth area along said axis perpendicular to [011] in case of an off angle $\theta$ toward [0$\bar{1}$1], and said lateral dimension d being in the range of 0.1 to 100 $\mu$m.

5. A method for the growth of silicon carbide single crystals, said method comprising the preparation of a silicon single crystal substrate having growth areas and the step of growing silicon carbide single crystals on the growth areas with a thickness approximately equal to or more than a critical thickness t, said growth areas having a crystal orientation of [100], said critical thickness t being approximately equal to $\sqrt{2}d$ for a lateral dimension d, said lateral dimension d being specified by rectangular coordinates attached onto said growth area, the two axes of said rectangular coordinates being taken parallel to [011] and [0$\bar{1}$1], said lateral dimension d being equal to the longer one of the length of said silicon carbide single crystal grown on said growth area along said axes, and said lateral dimension d being in the range of 0.1 to 100 $\mu$m.

6. A method for the growth of silicon carbide single crystals according to claim 4, wherein said off angle $\theta$ is equal to $\tan^{-1}(\sqrt{2}/n)$ from the [100] direction toward the [011] direction, said critical thickness t being approximately equal to $\sqrt{2}d(n+1)/|n-2|$ (where n is an integer of from 1 to 8, with proviso that it is not equal to 2).

7. A method for the growth of silicon carbide single crystals according to claim 6, wherein n is equal to 6.

8. A method for the growth of silicon carbide single crystals according to claim 2, wherein n is equal to 6.

* * * * *